(12) United States Patent
Magers et al.

(10) Patent No.: US 11,774,475 B2
(45) Date of Patent: Oct. 3, 2023

(54) DUAL DIRECTIONAL ASYMMETRIC COUPLER WITH A SHARED THROUGH-LINE

(71) Applicant: NATIONAL INSTRUMENTS CORPORATION, Austin, TX (US)

(72) Inventors: Justin Regis Magers, Santa Rosa, CA (US); Michael Joseph Seibel, Santa Rosa, CA (US); Marcus Kieling daSilva, Leander, TX (US)

(73) Assignee: National Instruments Corporation, Austin, TX (US)

( * ) Notice: Subject to any disclaimer, the term of this patent is extended or adjusted under 35 U.S.C. 154(b) by 37 days.

(21) Appl. No.: 17/374,697

(22) Filed: Jul. 13, 2021

(65) Prior Publication Data

US 2023/0019522 A1 Jan. 19, 2023

(51) Int. Cl.
  *G01R 27/06* (2006.01)
  *G01R 27/28* (2006.01)
(52) U.S. Cl.
  CPC ............. *G01R 27/06* (2013.01); *G01R 27/28* (2013.01)
(58) Field of Classification Search
  CPC .................................. G01R 27/06; G01R 27/28
  See application file for complete search history.

(56) References Cited

U.S. PATENT DOCUMENTS

| 9,222,850 B2* | 12/2015 | Couch | G01M 11/31 |
| 11,233,585 B2* | 1/2022 | Horsfield | G01R 27/32 |
| 2007/0159182 A1* | 7/2007 | Bradley | G01R 27/28 |
| | | | 324/638 |
| 2016/0211928 A1* | 7/2016 | Brewer | H04B 17/103 |
| 2017/0153280 A1* | 6/2017 | Mikulka | G01R 35/00 |
| 2020/0119424 A1* | 4/2020 | Lim | H01P 5/18 |

OTHER PUBLICATIONS

"Directional Couplers", microwaves101.com/encyclopedias/directional-couplers; 7 pgs.
Bickford, et al., "Ultra-Broadband High-Directional Coupler Design"; IEEE; V-5; 1988; pp. 595-598.
"What is a Dual Directional Coupler?", RF everythingrf.com/community/what-is-a-dual-directional-coupler; Feb. 2017; 3 pgs.

* cited by examiner

*Primary Examiner* — Akm Zakaria
(74) *Attorney, Agent, or Firm* — Kowert, Hood, Munyon, Rankin & Goetzel, P.C.; Jeffrey C. Hood

(57) ABSTRACT

A reflectometer may include two directional couplers in a parallel configuration, sharing the same section of a signal line or through-line. For example, two directional couplers may be disposed across from each other on opposite sides of the shared through-line. One of the directional couplers may couple, to a first port of the reflectometer, a portion of the signal power of a first signal flowing from the first end of the shared through-line to the second end of the shared through-line, and the other directional coupler may couple, to a second port of the reflectometer, a portion of the signal power of a second signal flowing from the second end of the shared through-line to the first end of the shared through-line. The reflectometer benefits from reduced size and signal loss with respect to reflectometers having a serial configuration. When used in vector network analyzer (VNA) systems, this results in higher output power and higher dynamic range of the VNA.

20 Claims, 7 Drawing Sheets

DUAL DIRECTIONAL ASYMMETRIC COUPLER WITH A SHARED THROUGH-LINE

FIELD OF THE INVENTION

The present invention relates to the field of electronic instrumentation, including vector network analyzers and dual directional asymmetric couplers with a shared through-line.

DESCRIPTION OF THE RELATED ART

Measurement systems are oftentimes used to perform a variety of functions, including measurement of physical phenomena, measurement of certain characteristics or operating parameters of a unit under test (UUT) or device under test (DUT), testing and analysis of physical phenomena, process monitoring and control, control of mechanical or electrical machinery, data logging, laboratory research, and analytical chemistry, to name a few examples.

A typical contemporary measurement system comprises a computer system, which commonly features a measurement device, or measurement hardware. The measurement device may be a computer-based instrument, a data acquisition device or board, a programmable logic device (PLD), an actuator, or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a USB (Universal Serial Bus), a GPM (General-Purpose Interface Bus), a VXI (VME extensions for Instrumentation) bus, a serial port, parallel port, or Ethernet port of the computer system. Optionally, the measurement system includes signal-conditioning devices, which receive field signals and condition the signals to be acquired.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a DUT or for influencing the system being controlled. These measurement systems, which can be generally referred to as data acquisition systems (DAQs), are primarily used for converting a physical phenomenon (such as temperature or pressure) into an electrical signal and measuring the signal in order to extract information. PC-based measurement and DAQs and plug-in boards are used in a wide range of applications in the laboratory, in the field, and on the manufacturing plant floor, among others.

Multifunction DAQ devices typically include digital I/O capabilities in addition to the analog capabilities described above. Digital I/O applications may include monitoring and control applications, video testing, chip verification, and pattern recognition, among others. DAQ devices may include one or more general-purpose, bidirectional digital I/O lines to transmit and receive digital signals to implement one or more digital I/O applications. DAQ devices may also include Source-Measure Units (SMUs), which may apply a voltage to a DUT and measure the resulting current, or may apply a current to the DUT and measure the resulting voltage. Measurement systems, e.g. DAQ devices as noted above, may also include oscilloscopes and/or other types of signal analyzers, signal generators, function analyzers, etc.

Typically, in a measurement or data acquisition process, analog signals are received by a digitizer, which may reside in a DAQ device or instrumentation device. The analog signals may be received from a sensor, converted to digital data (possibly after being conditioned) by an Analog-to-Digital Converter (ADC), and transmitted to a computer system for storage and/or analysis. Then, the computer system may generate digital signals that are provided to one or more digital to analog converters (DACs) in the DAQ device. The DACs may convert the digital signal to an output analog signal that is used, e.g., to stimulate a DUT or to influence the system being controlled.

One widely used instrumentation device is the network analyzer, which measures the network parameters of electrical networks. Network analyzers commonly measure reflection and transmission of electrical networks at high frequencies, and are often used to characterize two-port networks such as amplifiers and filters. Network analyzers can also be used on networks with an arbitrary number of ports. While network analyzers are used mostly at high frequencies, operating frequencies may range from 1 Hz to 1.5 THz, as certain types of network analyzers also cover lower frequency ranges down to 1 Hz. There are two basic types of network analyzers, scalar network analyzers (SNAs), which measure amplitude properties only, and vector network analyzers (VNAs), which measure both amplitude and phase properties. A VNA is a form of RF network analyzer widely used for RF design applications, and may also be considered a gain-phase meter or an automatic network analyzer. VNAs are the most common type of network analyzers.

One type of component often used in instrumentation systems, for example with VNAs, is a radio frequency (RF) directional coupler. RF directional couplers (or directional RF couplers) are electronic components used to couple a defined amount of the electromagnetic power in a transmission line to a port, thereby enabling the signal to be used in another circuit. Directional couplers only couple power, (traveling waves), in one direction. In this way, power entering the output port is coupled to the coupled port but not to the isolated port. RF directional couplers can be implemented using a variety of transmission lines including microstrip, stripline, coaxial, waveguide, rectangular bars or rods, and lumped or discrete elements, and may also be included within a variety of packages from blocks with RF connectors or solder pins, on a substrate carrier, or as part of a larger unit that includes additional functionality. Depending on their use, directional couplers may begin to exhibit certain disadvantages. Improvements in the field are therefore required.

Other corresponding issues related to the prior art will become apparent to one skilled in the art after comparing such prior art with the present invention as described herein.

SUMMARY OF THE INVENTION

An improved reflectometer (or dual directional coupler) may include two directional couplers in a parallel configuration in which the two directional couplers share the same section of a signal line or signal through-line. In some embodiments, the two directional couplers may be thereby disposed across from each other on opposite sides of the shared section of the signal line or through-line.

Pursuant to the above, a reflectometer may include a first port and a second port, and may further include a first directional coupler and a second directional coupler configured to share a section of a signal line having a first end and a second end. The first directional coupler may couple, to the first port, at least a portion of the signal power of a first signal flowing from the first end of the signal line through the shared section of the signal line to the second end of the signal line. The second directional coupler may couple, to the second port, at least a portion of the signal power of a second signal flowing from the second end of the signal line through the shared section of the signal line to the first end of the signal line.

The reflectometer may also include a third port and a fourth port each terminated with a characteristic impedance of a system in which the reflectometer is used. The reflectometer may further include a first coupling line that couples the first port to the third port and a second coupling line that couples the second port to the fourth port, with the first and second coupling lines configured such that the coupling between the first line and the second line is reduced. In some embodiments, the first port and the second port may couple to respective receivers. A physical length of the reflectometer may correspond to approximately one-half of a wavelength of an operating corner frequency of the reflectometer (referred to herein as the corner frequency). The first port, the second port, the first directional coupler, and the second directional coupler may all be configured or disposed (manufactured) on a printed circuit board. Furthermore, the reflectometer may be included in a measurement instrument, for example a vector network analyzer (VNA).

A VNA system may therefore include one or more signal ports, one or more test ports respectively coupling to the one or more signal ports via respective signal lines, and one or more reflectometers respectively corresponding to the respective signal lines, with each respective reflectometer corresponding to a respective signal line. Each reflectometer may include a first port and a second port, and a first directional coupler and a second directional coupler that share a section of the respective signal line corresponding to the respective reflectometer. The first directional coupler may couple, to the first port, at least a portion of the signal power of a first signal flowing from the signal port of the respective signal line to the test port of the respective signal line through the shared section of the respective signal line, and the second directional coupler may couple, to the second port, at least a portion of the signal power of a second signal flowing from the test port of the respective signal line to the signal port of the respective signal line through the shared section of the respective signal line.

Other aspects of the present invention will become apparent with reference to the drawings and detailed description of the drawings that follow.

BRIEF DESCRIPTION OF THE DRAWINGS

A better understanding of the present invention can be obtained when the following detailed description of the preferred embodiment is considered in conjunction with the following drawings, in which.

Figure 1:
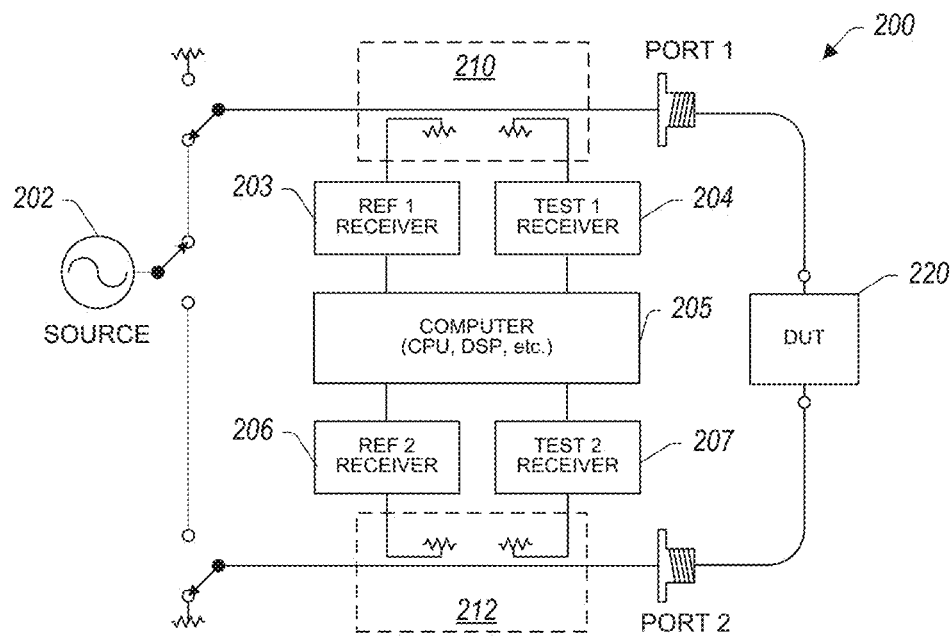
FIG. 1 shows a partial circuit diagram of an exemplary vector network analyzer (VNA) system with dual directional couplers (reflectometers), according to prior art.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

Embodiments of asymmetric directional (RF) couplers disclosed herein may be used in a variety of systems and devices that require directional (RF) couplers. Such devices and systems include systems designed to perform test and/or measurement functions, to control and/or model instrumentation or industrial automation hardware, or to model and simulate functions, e.g., modeling or simulating a device or product being developed or tested, etc. Embodiments of the asymmetric directional couplers may also be used with various radio frequency (RF) devices such as vector network analyzers (VNAs), for example. More specifically, embodiments of the disclosed asymmetric directional couplers may be used in various instances where simultaneous monitoring of both forward and reverse power going through a system is desired. However, it is noted that various embodiments may be used for a variety of applications, and such applications are not intended to be limited to those enumerated above or explicitly disclosed herein. In other words, applications discussed in the present description are exemplary only, and various embodiments of asymmetric directional couplers may be used in any of various types of systems.

While various embodiments are described herein in greater detail with respect to a VNA, the connectivity/connection technology described herein may equally be used with, and/or applied to many other test instruments, such as semiconductor test equipment or remote sensing equipment, just to name a couple. In various embodiments, an asymmetric directional coupler may be used to couple a variety of different devices (under test) to a variety of different instruments, to provide improved simultaneous monitoring of both the forward and reverse power going through a transmission line system.

Dual Directional Couplers

Figure 2:
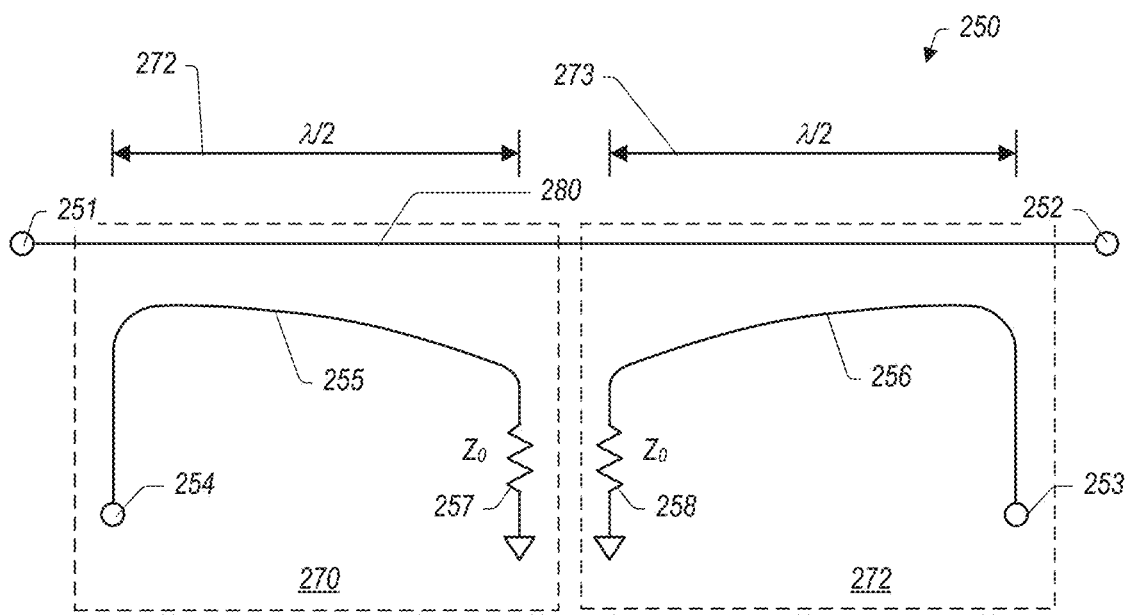
FIG. 2 shows a partial circuit representation of an exemplary dual directional coupler (reflectometer), according to prior art.

As previously mentioned, directional (RF) couplers are electronic components used to couple a defined amount of the electromagnetic power in a transmission line to a port, thereby enabling the signal to be used in another circuit. A dual directional coupler is a device which can be used to simultaneously monitor both the forward and reverse power going through a transmission line system. A dual directional coupler (also referred to herein as a reflectometer) may be obtained or constructed by connecting two directional couplers "in series" as shown in FIG. 2. A dual directional coupler, or reflectometer, 250 includes a first directional coupler 270 and a second directional coupler 272. Directional coupler 270 includes a coupler port 254 for signals travelling in the direction from port 251 to port 252 on signal through-line 280, while directional coupler 272 includes a coupler port 253 for signals travelling in the direction from port 252 to port 251 on signal through-line 280. In other words, directional coupler 270 (having port 254, terminating impedance 257, and coupler line 255) is configured in series with directional coupler 272 (having port 253, terminating impedance 258, and coupler line 256), and coupler 270 couples signals travelling from port 251 to port 252 while coupler 272 couples signals travelling from port 252 to port 251. It should be noted that that the transmission lines included in a directional coupler may have a varying characteristic impedance along their length. Furthermore, the impedance may be an odd mode impedance defined as the impedance of a single transmission line when the two lines in a pair are driven with signals of the same amplitude and opposite polarity, or it may be an even mode impedance defined as the impedance of a single transmission line when the two lines in the pair are driven with signals of the same amplitude and same polarity. Typically, the geometric mean of the even and odd mode impedance is equal to the characteristic impedance of the system. The series arrangement illustrated in FIG. 2 is typically used in commercially available VNAs, for example.

FIG. 1 shows a simplified block diagram of an exemplary VNA system 200 with two test ports, PORT 1 and PORT 2, respectively coupled to corresponding ends of a device under test (DUT) 220. VNA system 200 is configured with dual directional couplers (reflectometers) according to prior art. As shown in FIG. 1, a signal source 202 may be switchably coupled to the signal path of PORT 1 or the signal path of PORT 2. Reflectometer 210 is used for monitoring both the forward and reverse power going through the signal path between the signal source 202 and PORT 1, by respectively coupling to a reference receiver 203 (for signals traveling from the direction of signal source 202 towards PORT 1) and a test receiver 204 (for signals traveling from the direction of PORT 1 towards signal source 202). Similarly, reflectometer 212 is used for monitoring both the forward and reverse power going through the signal path between the signal source 202 and PORT 2, by respectively coupling to a reference receiver 206 (for signals traveling from the direction of signal source 202 towards PORT 2) and a test receiver 207 (for signals traveling from the direction of PORT 2 towards signal source 202). As further shown in FIG. 1, reflectometer 210 includes two directional couplers configured/disposed in series alongside the signal path of PORT 1, and reflectometer 212 includes two directional couplers configured/disposed in series alongside the signal path of PORT 2. More specifically, the first directional coupler of reflectometer 210 couples the path between signal source 202 and PORT 1 to reference receiver 203 while the second directional coupler of reflectometer 210 couples the path between PORT 1 and signal source 202 to test receiver 204. Similarly, the first directional coupler of reflectometer 212 couples the path between signal source 202 and PORT 2 to reference receiver 206 while the second directional coupler of reflectometer 212 couples the path between PORT 2 and signal source 202 to test receiver 207. A host system, illustrated as computer 205 (which may be a processor, digital signal processing circuitry, or any similar circuitry), is used to control and/or interface with receivers 203, 204, 206, and 207, for example to log measurements, perform analysis, etc. In some cases, computer/host system 205 may be used to control VNA system 200 altogether.

For VNAs that operate in the 20+ GHz range, each coupler in VNA system 200 is typically an asymmetric tapered coupler. As opposed to symmetric couplers, asymmetric couplers are half as long and do not have a 90 degree phase difference between the output and the coupled lines. Tapered couplers are used because they are high-pass structures capable of operating over very large frequency ranges (e.g. on the order of three decades). It should be noted that a single coupler may be used to monitor both the forward and reverse power and is typically referred to as a bi-directional coupler. However, using internal, well-matched loads in a dual directional coupler (e.g. matched loads 257 and 258) helps remove errors associated with poor (reflective) terminations that might be present in real systems.

One major disadvantage of the reflectometer arrangement illustrated in FIG. 1 is that it is relatively large. Specifically, the arrangement results in roughly one-half wavelength for each coupler at the corner frequency (as indicated by 272 and 273 in FIG. 2), or a total of one (single) wavelength at the corner frequency, not including the connectors and/or cables in-between them. Additionally, due to the long electrical length, the coupler may incur a sizable signal loss. Even couplers that are implemented in very low loss mediums (such as coupled rectangular bars in air between parallel plates or round rods in air separated by a septum), the loss may be on the order of 3 dB at 30 GHz. In VNAs, this loss directly reduces the output power from the source and therefore reduces the dynamic range of the VNA.

Reflectometer with Shared Through-Line

Figure 4:
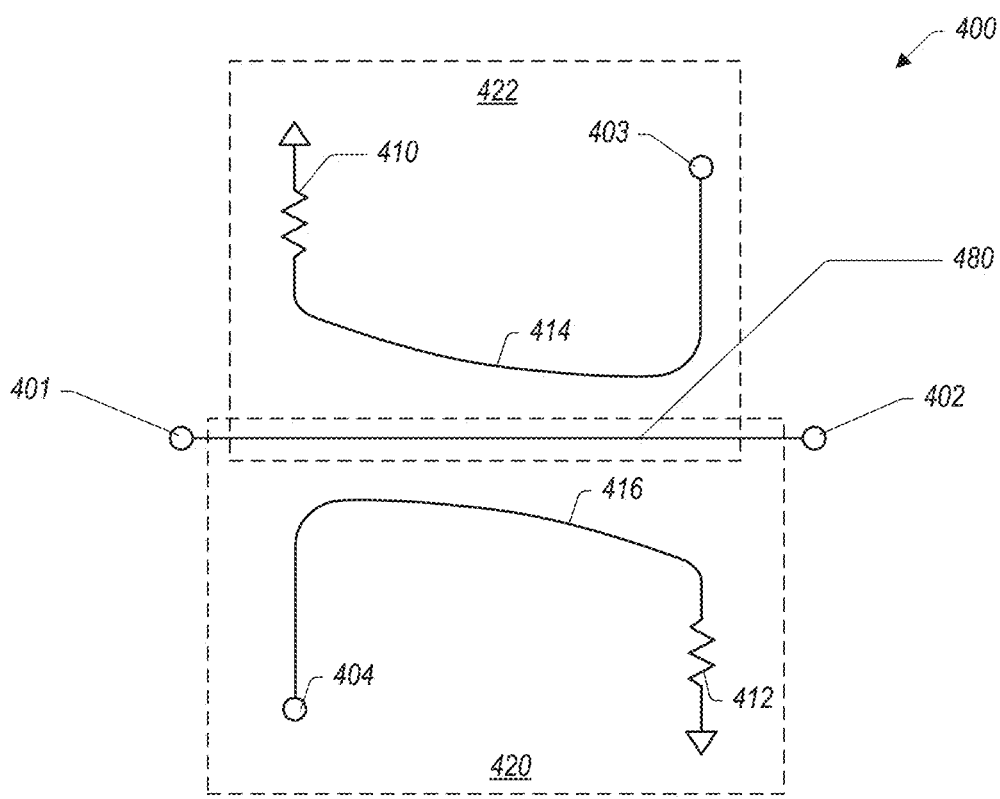
FIG. 4 shows a partial circuit representation of an exemplary dual directional coupler (reflectometer) with a shared through-line, according to some embodiments.

In order to overcome at least some of the disadvantages noted above, an improved reflectometer, or dual directional coupler, may be configured such that the individual couplers are rearranged across from each other to share a same section of a through-line. A simplified equivalent circuit diagram of an improved reflectometer is illustrated in FIG. 4, which shows a dual directional coupler, or reflectometer, 400 that includes two directional couplers 420 and 422 disposed or configured across from each other at two sides of a signal through-line 480 running between ports 401 and 402. In reflectometer 400, port 404 of directional coupler 420 (having coupler line 416, terminating impedance 412, and a designated portion of signal line 480) is for coupling signals travelling in the direction from port 401 to port 402, and port 403 of directional coupler 422 (having coupler line 414, terminating impedance 410, and the same designated portion of signal line 480) is for coupling signals travelling in the direction from port 402 to port 401. In arrangement 400, the reflectometer 400 is half as long (one-half wavelength at the corner frequency) as the reflectometers 250 illustrated in FIG. 2, and therefore the signal is subject to only half of the signal loss. When using reflectometer 400 in VNAs, this translates to higher output power and higher dynamic range. Additionally, the reduced size allows multiple couplers to be used in the limited space in multi-port applications, e.g. in semiconductor test systems and/or test modules (e.g. PXI systems) in which reflectometers are typically used. In some embodiments, port 403, terminating impedance 410, and coupler line 414 (i.e., components of coupler 422) may be configured on the same circuit layers as port 404, terminating impedance 412, and coupler line 416 (i.e., components of coupler 420), while in other embodiments, port 403, terminating impedance 410, and coupler line 414 may be configured on different circuit layers than port 404, terminating impedance 412, and coupler line 416, while in yet other embodiments the circuit layers on which directional couplers 420 and 422 are configured may be partially the same (and hence, partially different).

Figure 3:
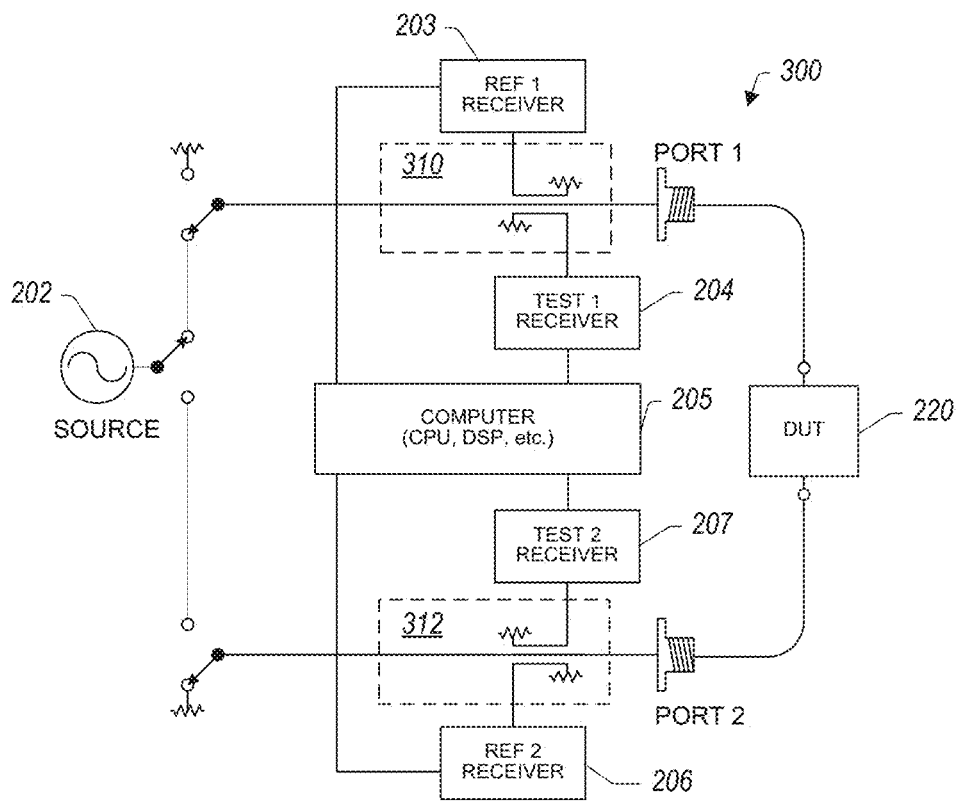
FIG. 3 shows a simplified block diagram of a VNA system using dual directional couplers (reflectometers) with a shared through-line, according to some embodiments.

FIG. 3 shows a simplified block diagram of an exemplary VNA system 300 similar to VNA system 200 of FIG. 1. VNA system 300 also includes two test ports, PORT 1 and PORT 2, respectively coupled to the corresponding ends of device under test (DUT) 220. However, in contrast to the VNA system 200 of FIG. 1, exemplary VNA system 300 is configured with dual directional couplers (reflectometers) having shared through-lines. As shown in FIG. 3, similar to VNA system 200, the signal source 202 may be switchably coupled to the signal path of PORT 1 or the signal path of PORT 2. Reflectometer 310 is used for monitoring both the forward and reverse power going through the signal path between the signal source 202 and PORT 1, by respectively coupling to the reference receiver 203 (for signals traveling from the direction of signal source 202 towards PORT 1) and the test receiver 204 (for signals traveling from the direction of PORT 1 towards signal source 202). Similarly, reflectometer 312 is used for monitoring both the forward and reverse power going through the signal path between the signal source 202 and PORT 2, by respectively coupling to the reference receiver 206 (for signals traveling from the direction of signal source 202 towards PORT 2) and the test receiver 207 (for signals traveling from the direction of PORT 2 towards signal source 202). However, in contrast to reflectometer 210, reflectometer 310 includes two directional couplers having a shared through-line portion of the signal path of PORT 1, with the two directional couplers configured/disposed across from each other on opposite sides of the through-line. Similarly, in contrast to reflectometer 212, reflectometer 312 includes two directional couplers having a shared through-line portion of the signal path of PORT 2, with the two directional couplers configured/disposed across from each other on opposite sides of the through-line. VNA system 300 may also include host system/computer 205 (which may be a processor, digital signal processing unit, or any other suitable control system) used to control and/or interface with receivers 203, 204, 206, and 207, at least in part for performing measurements, analysis, etc. In some embodiments, computer/host system 205 may be used to control operation of VNA system 300.

Figure 5:
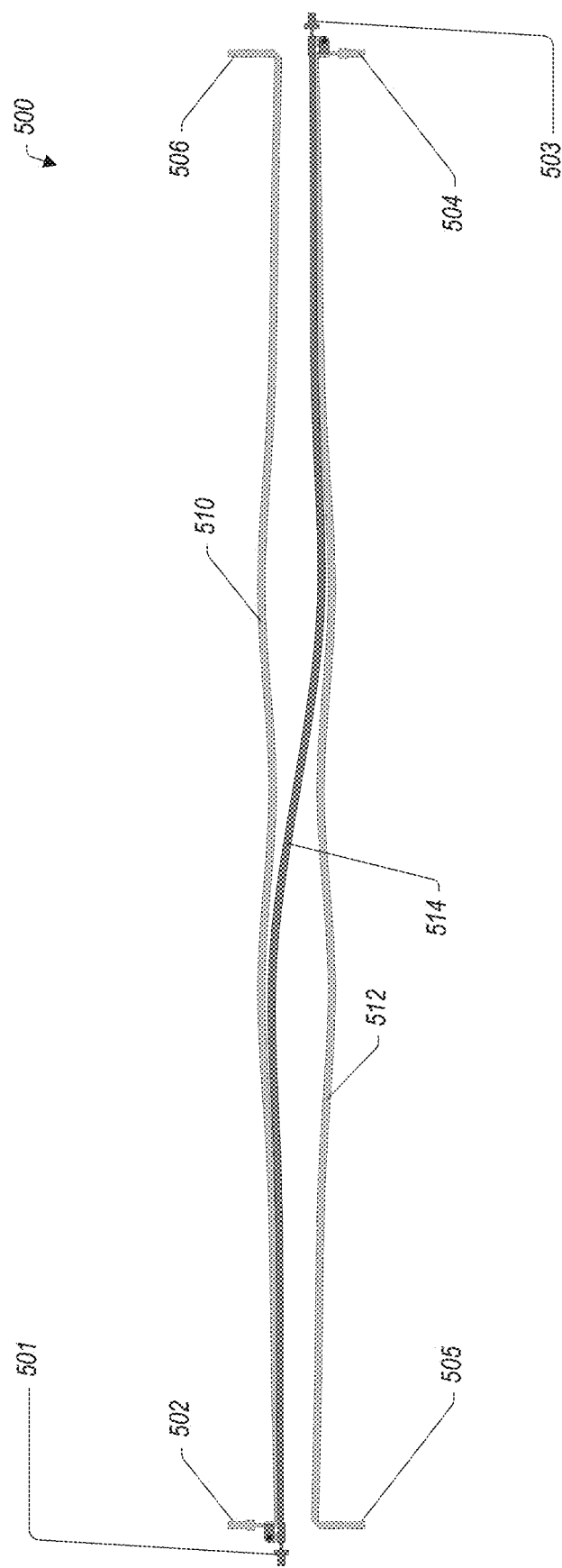
FIG. 5 shows a simplified top view of one implementation of an exemplary dual directional coupler (reflectometer) with a shared through-line, according to some embodiments.

A simplified top view of one implementation of reflectometer 400 according to some aspects is shown in FIG. 5. As shown in FIG. 5, reflectometer 500 includes lines 510 and 512, and line 514 representing the signal through-line across which the two directional couplers of reflectometer 500 are configured or disposed. The illustrated reflectometer 500 is printed on the inner layers (510, 512, and 514) of a printed circuit board. A first directional coupler includes port 502, line 510, and port 506, while a second directional coupler includes port 504, line 512, and port 505. Ports 501 and 503 define the signal through path 514. Ports 501 and 502 define the forward coupling path through which power waves incident on port 501 are coupled into port 502. Ports 503 and 504 form the reverse coupling path through which power waves incident on port 503 are coupled into port 504. Ports 505 and 506 are terminated in the characteristic impedance of the system, e.g. 50 ohms. Reflectometer 500 may be used in a VNA. In a VNA application, ports 501, 502, 503, and 506 form a reference coupler, and ports 501, 503, 504, and 505 form a test coupler. In other words, a signal source for the VNA may be coupled to port 501 while the port of the VNA may be coupled to port 503. The reference and test receivers may then be coupled to ports 502 and 504, respectively.

Figure 6:
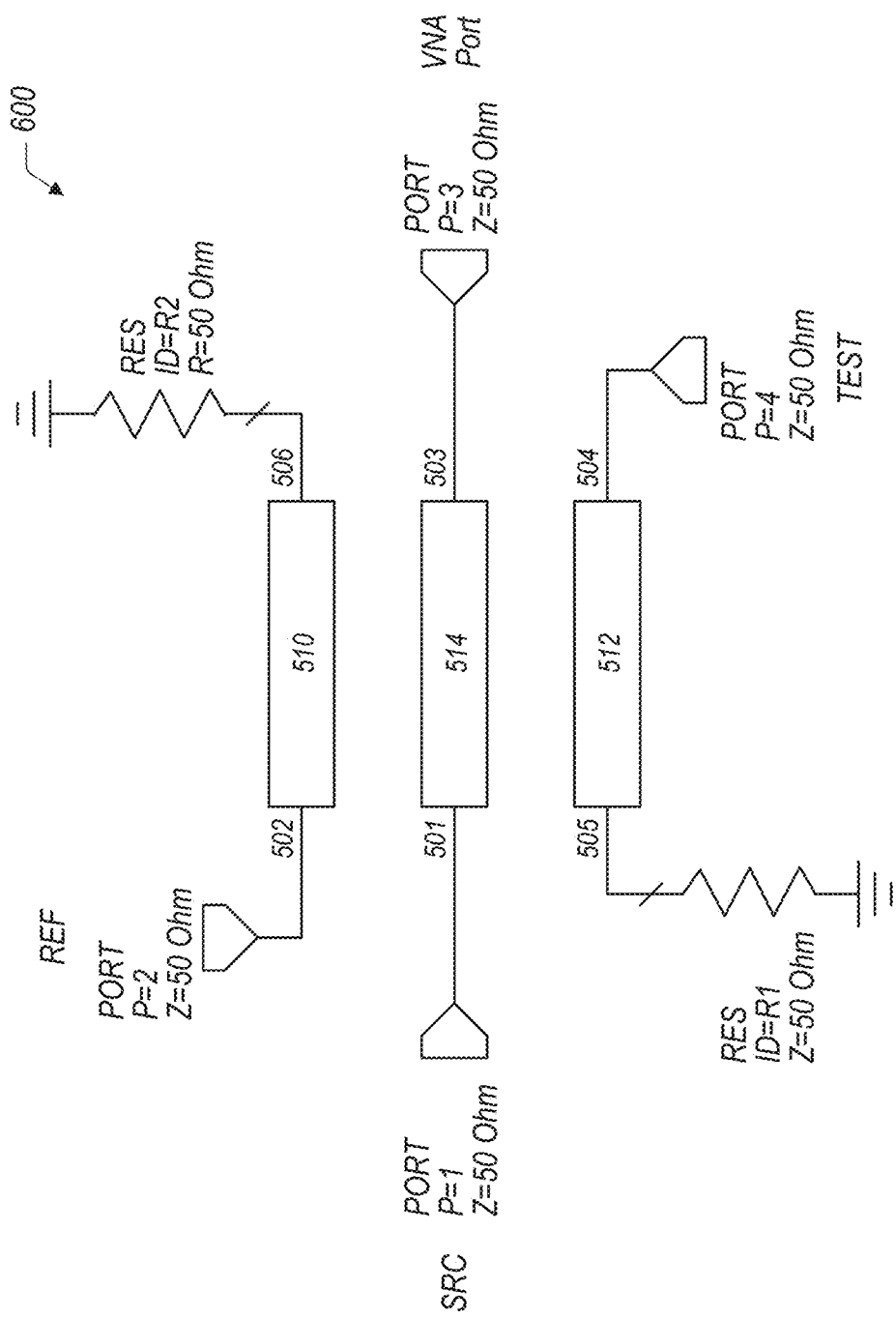
FIG. 6 shows a simplified 4-port circuit representation of an exemplary synthesized reflectometer with a shared through-line in a VNA application, according to some embodiments.

FIG. 6 shows a partial circuit diagram representative of a practical implementation of a novel reflectometer exemplified in FIGS. 4 and 5. Reflectometer 600 is implemented on a multilayer printed circuit board (PCB) using EM-890K with a relative dielectric constant of about 3. The coupled transmission lines are constructed using broadside coupled stripline on the inner layers of the board. The numeric references of the ports and lines (traces) in circuit 600 correspond to those shown in FIG. 5 for easy identification of each corresponding element.

Figure 7:
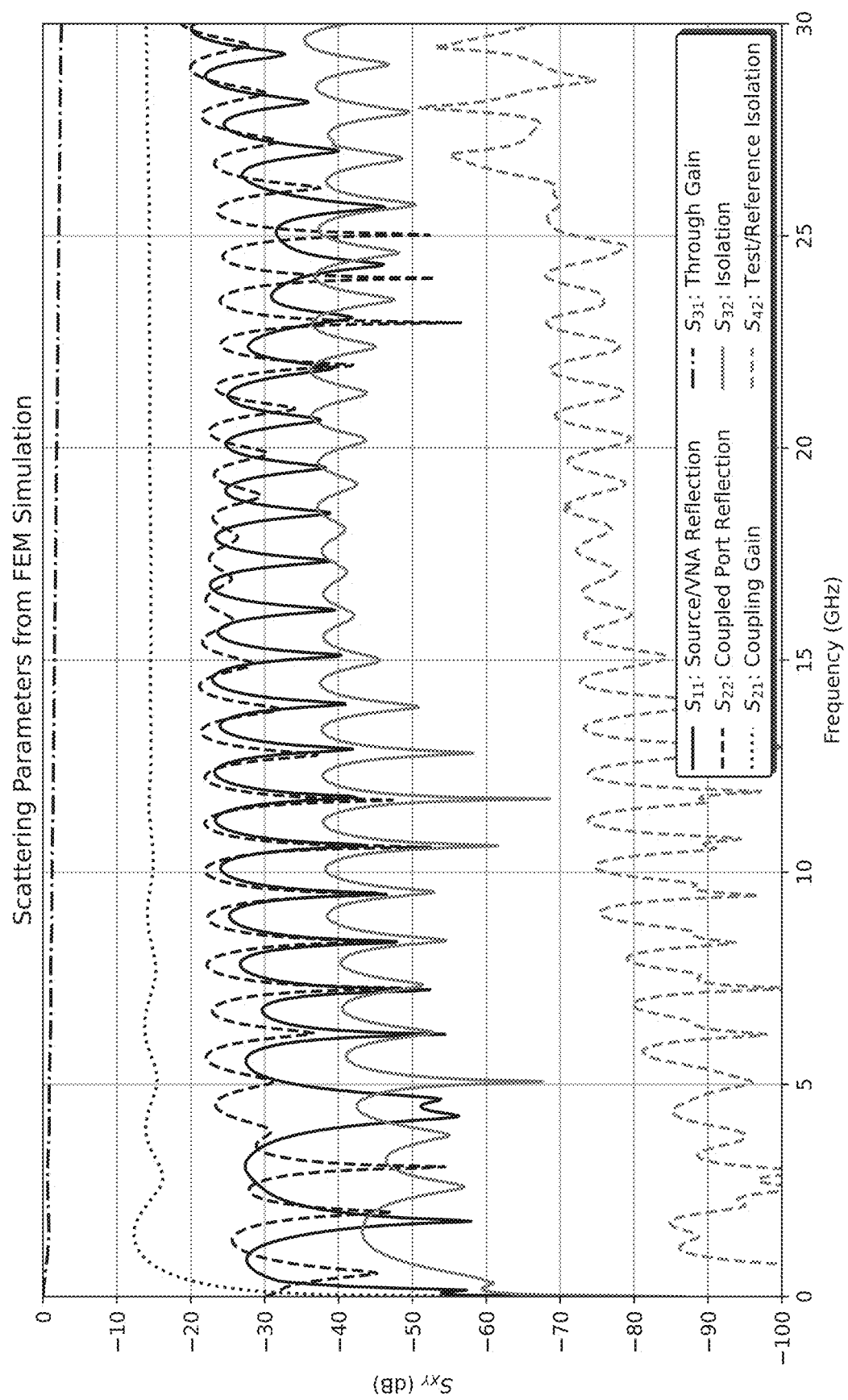
FIG. 7 shows a diagram representative of simulation results for an exemplary synthesized reflectometer with a shared through-line in a VNA application, according to some embodiments.

In order to obtain information representative of the potential performance of the reflectometer, the reflectometer 600 shown was simulated using the finite element method (FEM) in CST Microwave Studio to compute the 4-port scattering parameters, with the result shown in FIG. 7. For simplicity, FIG. 6 only shows the inner layers of the reflectometer and omits the transition vias (connections) to the top and/or bottom layers of the PCB and the termination resistors at nodes 505 and 506, even though these structures are part of the FEM simulation. The 4-port reflectometer 600 has symmetry about ports 1 (501) and 3 (503) and ports 2 (502) and 4 (504), therefore $S_{33}=S_{11}$, $S_{44}=S_{22}$, $S_{13}=S_{31}$, $S_{43}=S_{34}=S_{12}=S_{21}$, $S_{24}=S_{42}$, and $S_{14}=S_{41}=S_{23}=S_{32}$. As a consequence, the performance of the reflectometer shown in FIG. 7 only includes the unique set of scattering parameters. For reflectometers used in network analyzers, a coupling factor of about 15 dB is typical in order to maximize the dynamic range of the instrument. Importantly, the coupling ($S_{21}$) is much greater than the isolation ($S_{32}$), which indicates that the coupling in the forward direction is much greater than the coupling in the reverse direction. This demonstrates that the reflectometer effectively separates signals travelling in the forward direction from signals travelling in the reverse direction, and vice-versa. Additionally, as can be seen from the simulation results, there appears to be minimal coupling between the coupling signal lines (e.g. lines 510 and 512 with reference to FIG. 5) of the reflectometer.

Exemplary Systems

Figure 8:
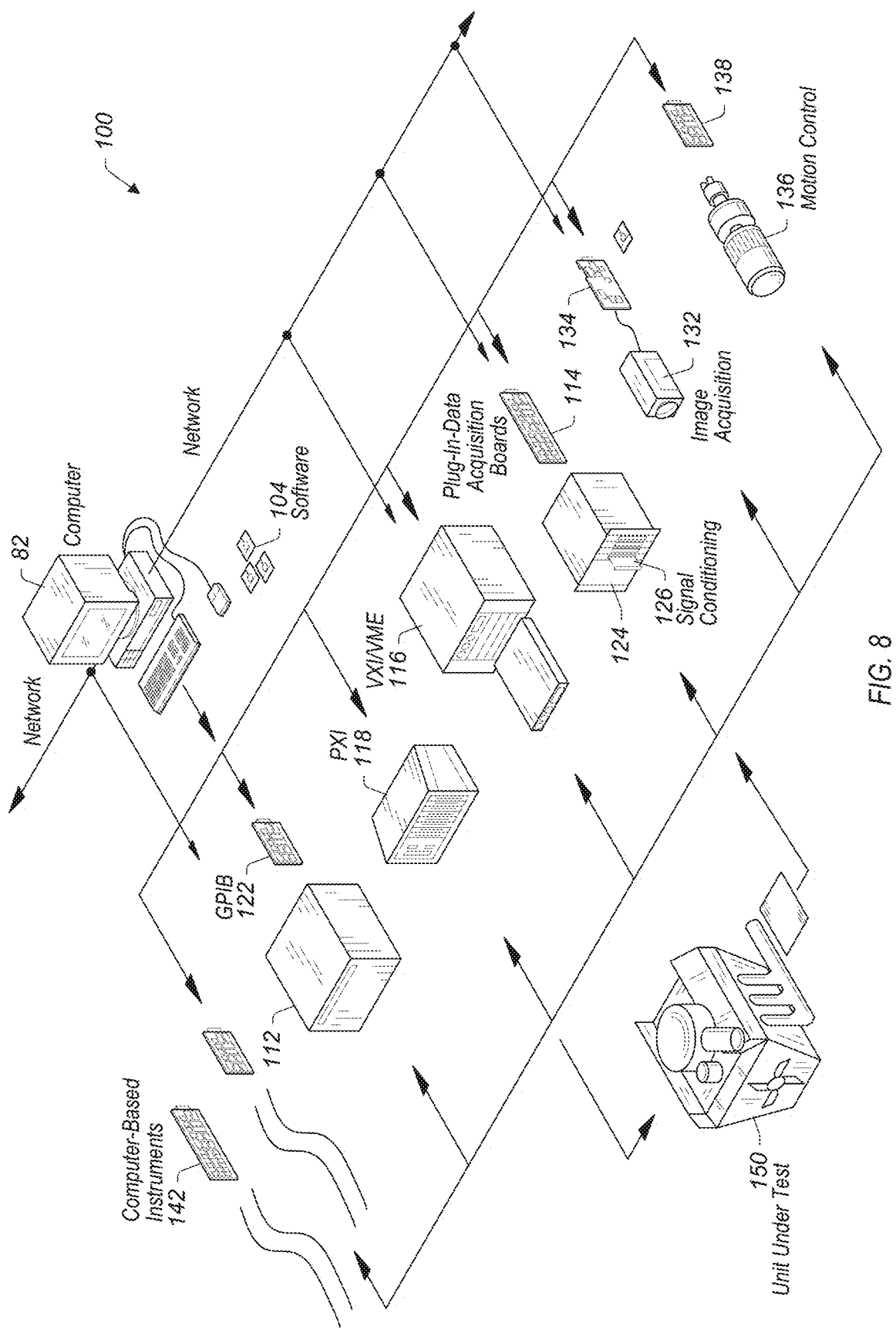
FIG. 8 shows an exemplary instrumentation control system with networked instruments which may feature dual directional asymmetric couplers with a shared through-line according to one set of embodiments.

FIG. 8 illustrates an exemplary instrumentation control system 100 which may feature dual directional asymmetric couplers with a shared through-line as disclosed herein. System 100 comprises a host computer 82 which may couple to one or more instruments configured to perform a variety of functions using a modular probe, implemented according to various embodiments. Host computer 82 may comprise a CPU, a display screen, memory, and one or more input devices such as a mouse or keyboard as shown. Computer 82 may operate with one or more instruments to analyze, measure, or control a unit under test (UUT) or process 150. The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. In some embodiments, at least one of the instruments may be a VNA, for example one of computer-based instruments 142 may include a VNA, or PXI instrument 118 may include a VNA, or an additional VNA (not shown) may be included in system 100. The computer system may couple to and operate with one or more of these instruments. In some embodiments, the computer system may be coupled to one or more of these instruments via a network connection, such as an Ethernet connection, for example, which may facilitate running a high-level synchronization protocol between the computer system and the coupled instruments. The instruments may be coupled to the unit under test (UUT) or process 150, or may be coupled to receive field signals, typically generated by transducers. System 100 may be used in a data acquisition and control applications, in a test and measurement application, an image processing or machine vision application, a process control application, a man-machine interface application, a simulation application, or a hardware-in-the-loop validation application, among others.

Figure 9:
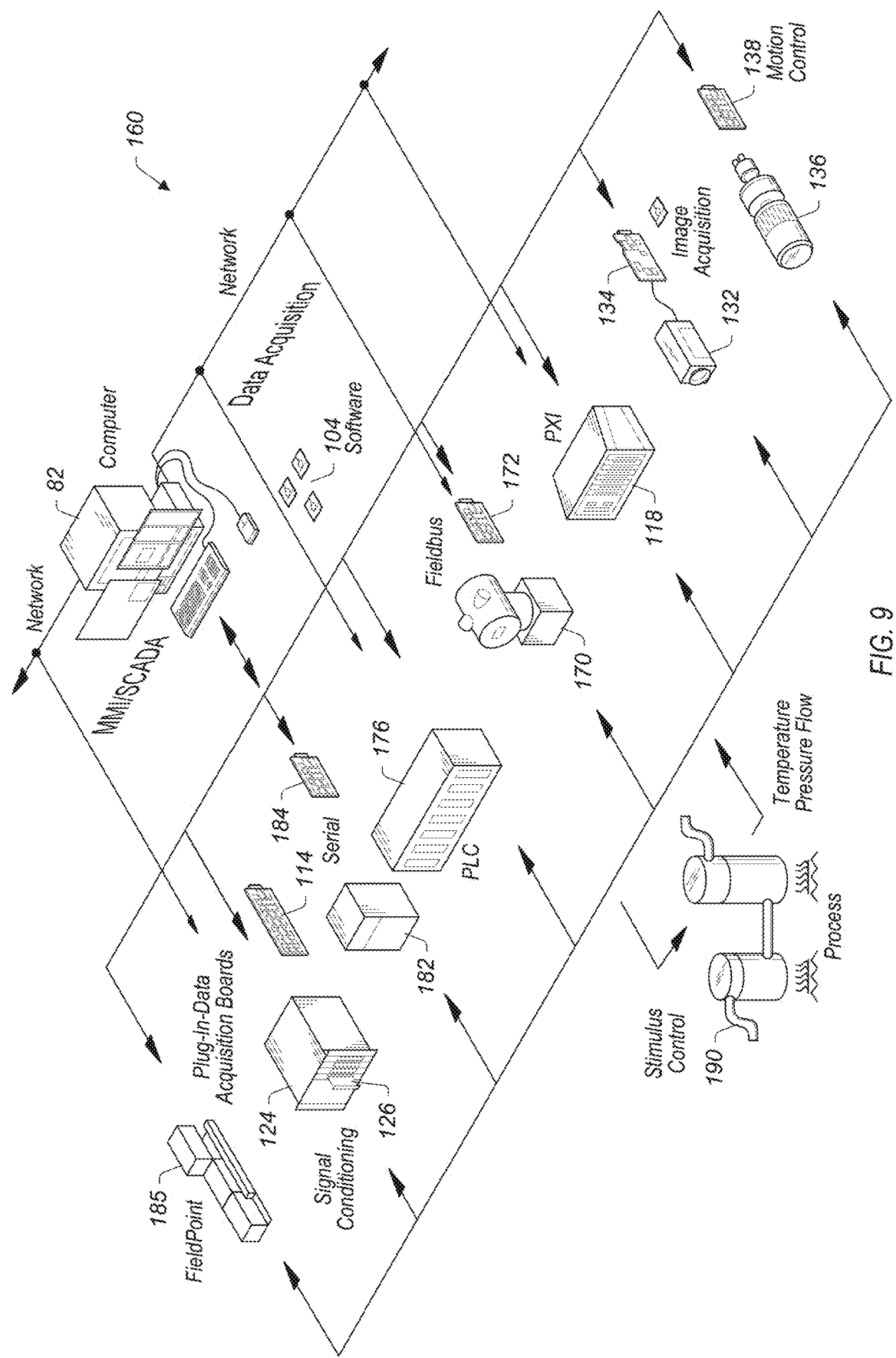
FIG. 9 shows an exemplary industrial automation system with networked instruments which may feature dual directional asymmetric couplers with a shared through-line according to one set of embodiments.

FIG. 9 illustrates an exemplary industrial automation system 160 which may feature dual directional asymmetric couplers with a shared through-line as disclosed herein. Industrial automation system 160 may be similar to instrumentation or test and measurement system 100 shown in FIG. 1. Elements that are similar or identical to elements in FIG. 1 have the same reference numerals for convenience. System 160 may comprise a computer 82 which may couple to one or more devices and/or instruments configured to use a modular probe as disclosed herein, according to various embodiments. Computer 82 may comprise a CPU, a display screen, memory, and one or more input devices such as a mouse or keyboard as shown. Computer 82 may operate with the one or more devices and/or instruments to perform an automation function, such as MMI (Man Machine Interface), SCADA (Supervisory Control and Data Acquisition), portable or distributed data acquisition, process control, and advanced analysis, among others, on process or device 150. The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a field bus device 170 and associated field bus interface card 172, a PLC (Programmable Logic Controller) 176, a serial instrument 182 and associated serial interface card 184, or a distributed data acquisition system, such as the Compact FieldPoint or CompactRIO systems available from National Instruments, among other types of devices. In some embodiments, at least one of the instruments may be a VNA, for example one of computer-based instruments 142 may include a VNA, or PXI instrument 118 may include a VNA, or an additional VNA (not shown) may be included in system 100. In some embodiments, similar to the system shown in FIG. 8, the computer system may couple to one or more of the instruments/devices via a network connection, such as an Ethernet connection, which may facilitate running a high-level synchronization protocol between the computer system and the coupled instruments/devices.

In one set of embodiments, any one or more of the instruments and/or the various connectivity interfaces of device under test 150 may connect to any one or more of the instruments and/or connectivity interfaces of device under test 150 using asymmetric directional couplers, as previously described in detail. Generally, various embodiments disclosed herein facilitate an instrument, for example an instrument such as a vector network analyzer (VNA), configured in an automated test system, to be used with asymmetric directional couplers to efficiently simultaneously monitor both the forward and reverse power going through a transmission line system.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A reflectometer comprising:
a first port and a second port; and
a first directional coupler and a second directional coupler configured to share a section of a signal line by being disposed across from each other on opposite sides of the signal line, the signal line having a first end and a second end;
wherein the first directional coupler is configured to couple, to the first port, at least a portion of signal power of a first signal flowing from the first end through the shared section of the signal line to the second end;
wherein the second directional coupler is configured to couple, to the second port, at least a portion of signal power of a second signal flowing from the second end through the shared section of the signal line to the first end; and
wherein a physical length of the reflectometer is one-half of a wavelength of a lowest operating corner frequency of the reflectometer.

2. The reflectometer of claim 1, further comprising:
a third port and a fourth port each configured with a respective termination having an impedance that minimizes reflections at the respective termination.

3. The reflectometer of claim 1, wherein the first port and the second port are configured to couple to respective receivers.

4. The reflectometer of claim 1, wherein the first port, the second port, the first directional coupler, and the second directional coupler are configured on a printed circuit board.

5. The reflectometer of claim 4, wherein components of the first directional coupler are configured on first circuit layers of the printed circuit board, and components of the second directional coupler are configured on one of:
the first circuit layers; or
second circuit layers of the printed circuit board, wherein the second circuit layers are one of:
different from the first circuit layers; or
partially the same as the first circuit layers.

6. The reflectometer of claim 1, wherein the signal line is comprised in a measurement instrument.

7. The reflectometer of claim 6, wherein the measurement instrument is a vector network analyzer.

8. A measurement system comprising:
a signal line coupling a signal port to a test port; and
a first directional coupler and a second directional coupler disposed across from each other on opposite sides of the signal line to share a section of the signal line;

wherein the first directional coupler is configured to couple, to a first port, at least a portion of signal power of a first signal flowing from the signal port to the test port;

wherein the second directional coupler is configured to couple, to a second port, at least a portion of signal power of a second signal flowing from the test port to the signal port; and wherein a physical length of the section of the signal line is one-half of a wavelength of an operating corner frequency of the reflectometer.

9. The measurement system of claim 8, further comprising:
a third port coupled to the first port via a first line; and
a fourth port coupled to the second port via second line;
wherein the third port and the fourth port are each terminated with a characteristic impedance of the measurement system.

10. The measurement system of claim 8, wherein the first port and the second port are coupled to respective receivers.

11. The measurement system of claim 8, wherein the first directional coupler and the second directional coupler are configured on a printed circuit board.

12. The measurement system of claim 8, wherein the signal line is comprised in a vector network analyzer.

13. A vector network analyzer (VNA) system comprising:
one or more signal ports;
one or more test ports respectively coupling to the one or more signal ports via respective signal lines; and
one or more reflectometers respectively corresponding to the respective signal lines, wherein each respective reflectometer of the one or more reflectometers corresponds to a respective signal line of the respective signal lines and comprises:
a first port and a second port; and
a first directional coupler and a second directional coupler disposed across from each other on opposite sides of the respective signal line to share a section of the respective signal line;
wherein the first directional coupler is configured to couple, to the first port, at least a portion of signal power of a first signal flowing from the signal port of the respective signal line to the test port of the respective signal line through the shared section of the respective signal line;
wherein the second directional coupler is configured to couple, to the second port, at least a portion of signal power of a second signal flowing from the test port of the respective signal line to the signal port of the respective signal line through the shared section of the respective signal line; and wherein for each respective reflectometer, a physical length of the respective reflectometer is one-half of a wavelength of a lowest operating corner frequency of the respective reflectometer.

14. The VNA system of claim 13, wherein each respective reflectometer further comprises:
a third port coupled to the first port via a first line; and
a fourth port coupled to the second port via second line;
wherein the third port and the fourth port are each configured with a respective termination having an impedance that minimizes signal reflections at the respective termination.

15. The VNA system of claim 14, wherein each respective reflectometer is configured to reduce a coupling between a respective coupling line of its first directional coupler and a respective coupling line of its second directional coupler.

16. The VNA system of claim 13, further comprising:
one or more first receivers, wherein each respective first receiver of the one or more first receivers is coupled to the first port of a respective corresponding reflectometer; and
one or more second receivers, wherein each respective second receiver of the one or more second receivers is coupled to the second port of the respective corresponding reflectometer.

17. The VNA system of claim 13, wherein each respective reflectometer of the one or more reflectometers is configured on a printed circuit board.

18. The VNA system of claim 17, wherein for each respective reflectometer of the one or more reflectometers:
components of the first directional coupler are configured on first circuit layers of the printed circuit board, and components of the second directional coupler are configured on one of:
the first circuit layers; or
second circuit layers of the printed circuit board, wherein the second circuit layers are one of:
different from the first circuit layers; or
partially the same as the first circuit layers.

19. The measurement system of claim 11, wherein components of the first directional coupler are configured on first circuit layers of the printed circuit board, and components of the second directional coupler are configured on one of:
the first circuit layers; or
second circuit layers of the printed circuit board, wherein the second circuit layers are one of:
different from the first circuit layers; or
partially the same as the first circuit layers.

20. The measurement system of claim 8 further comprising a vector network analyzer, wherein the signal line is comprised in the vector network analyzer.

* * * * *